US012460291B2

(12) United States Patent
Riemer et al.

(10) Patent No.: US 12,460,291 B2
(45) Date of Patent: Nov. 4, 2025

(54) SURFACE TREATMENT PRODUCING HIGH CONDUCTIVITY VIAS WITH SIMULTANEOUS POLYMER ADHESION

(71) Applicant: Hutchinson Technology Incorporated, Hutchinson, MN (US)

(72) Inventors: Douglas P. Riemer, Waconia, MN (US); Andrew R. Dick, Eau Claire, WI (US)

(73) Assignee: Hutchinson Technology Incorporated, Hutchinson, MN (US)

(*) Notice: Subject to any disclaimer, the term of this patent is extended or adjusted under 35 U.S.C. 154(b) by 0 days.

(21) Appl. No.: 17/560,091

(22) Filed: Dec. 22, 2021

(65) Prior Publication Data

US 2022/0205080 A1 Jun. 30, 2022

Related U.S. Application Data

(60) Provisional application No. 63/132,977, filed on Dec. 31, 2020.

(51) Int. Cl.
*C23C 14/14* (2006.01)
*C23C 14/58* (2006.01)
*H01J 37/32* (2006.01)

(52) U.S. Cl.
CPC .......... *C23C 14/5873* (2013.01); *C23C 14/14* (2013.01); *H01J 37/32357* (2013.01); *H01J 2237/334* (2013.01)

(58) Field of Classification Search
CPC . C23C 14/5873; C23C 14/14; H01J 37/32357
See application file for complete search history.

(56) References Cited

U.S. PATENT DOCUMENTS

| | | | | |
|---|---|---|---|---|
| 6,734,102 | B2 | 5/2004 | Rathi et al. | |
| 11,443,933 | B1 * | 9/2022 | Yamada | H01J 49/105 |
| 2003/0022509 | A1 * | 1/2003 | Rathi | B08B 7/0035 257/E21.585 |
| 2017/0275499 | A1 * | 9/2017 | Hähnel | B29C 59/14 |
| 2020/0281727 | A1 * | 9/2020 | Dang | A61B 17/68 |

OTHER PUBLICATIONS

Song et al. Electron energy distributions in a magnetized inductively coupled plasma, Sep. 26, 2014, Physics of Plasmas 21, 093512 (2014). (Year: 2014).*

* cited by examiner

*Primary Examiner* — Hai Y Zhang
(74) *Attorney, Agent, or Firm* — DLA Piper LLP (US)

(57) ABSTRACT

Treatment solutions and methods for treating a substrate including forming a first layer on a surface of the substrate, providing a process gas to the one or more plasma sources, the process gas includes a gas mixture of a reactive gas species and an inert gas species; forming a plasma under vacuum in the one or more plasma sources; and exposing the substrate to the plasma under vacuum to treat the first layer on the surface of the substrate.

12 Claims, 6 Drawing Sheets

SURFACE TREATMENT PRODUCING HIGH CONDUCTIVITY VIAS WITH SIMULTANEOUS POLYMER ADHESION

CROSS-REFERENCE TO RELATED APPLICATIONS

This application claims the benefit of and priority from U.S. Provisional Patent Application No. 62/132,977, filed on Dec. 31, 2020, the disclosure of which is hereby incorporated by reference in its entirety.

TECHNICAL FIELD

The present disclosure relates to treatment methods and solutions for modifying multiple polymer types to improve adhesion of sputter coated metals and improving contact resistance of formed electrical vias to an underlying conductive layer.

BACKGROUND

Various processes in electronic device manufacturing commonly require pretreatment, cleaning, or processing of substrates prior to deposition of material on the surface of the substrates. In some instances, metal oxides and carbon deposits, as well as potentially other contaminants, may form on a substrate surface that may present challenges to deposition of subsequent layers. Therefore, various pretreatment processes may be used to remove metal oxides and other contaminants.

An example of treating or otherwise processing a substrate prior to deposition can be reducing or eliminating metal oxides on a metal layer or semi-noble metal layer. Typically, substrates in an electronic device manufacturing process can be treated or otherwise processed using plasma. The plasma may be very effective in cleaning substrate surfaces, especially in removing metal oxides, hydrocarbons, and other contaminants.

Formation of metal wiring interconnects in integrated circuits (ICs) can be achieved using a damascene or dual damascene process. Typically, trenches or holes are etched into dielectric material, such as silicon dioxide, located on a substrate. The holes or trenches may be lined with one or more adhesion and/or diffusion barrier layers. Then a thin layer of metal may be deposited in the holes or trenches that can act as a seed layer for electroplated metal. Thereafter, the holes or trenches may be filled with electroplated metal. Typically, the seed metal is copper. However, other metals such as ruthenium, palladium, iridium, rhodium, osmium, cobalt, nickel, gold, silver, and aluminum, or alloys of these metals, may also be used. To achieve higher performance ICs, many of the features of the ICs are being fabricated with smaller feature sizes and higher densities of components. Technical challenges arise with smaller feature sizes in producing metal seed layers and metal interconnects substantially free of voids or defects, with good conductive paths connecting wiring layers.

SUMMARY

Treatment solutions and methods for improving adhesion of electroplating metal onto polymer surfaces while also decreasing contact resistance of metal surfaces are provided herein. More specifically, the disclosure relates to a method of treating a substrate including forming a first layer on a surface of the substrate, providing a process gas to the one or more plasma sources, the process gas includes a gas mixture of a reactive gas species and an optional inert gas species; forming a plasma under vacuum in the one or more plasma sources; and exposing the substrate to the plasma under vacuum to treat the first layer on the surface of the substrate.

In some examples, the substrate is provided between a substrate web and one or more plasma sources. The plasma sources can include one or more plasma generators that operate in a vacuum environment. Moreover, the low-pressure environment can include a pressure of about 1 milliTorr. In some examples, the one or more plasma sources generate plasma by implementing an operation of linear ion sources by DC excitation and in other examples the plasma sources generate plasma by means of an AC glow discharge or capacitive discharge.

In some examples, the method also includes applying a voltage discharge that split ammonia into hydrogen and nitrogen species. The voltage discharge may be between 1,500 V and about 5,000 V and the voltage discharge has a frequency between about 20 kHz to 50 kHz and about 100 kHz to 500 kHz. The voltage discharge can be between 2,500 V and 3,000 V. In some examples, the web substrate has a web speed between 1 meter/minute to 3 meter/minute.

In some examples a linear ion source splits ammonia into hydrogen and nitrogen species, the voltage discharge is between 1,500 V and about 5,000 V and is a DC excitation. The linear ion source may also maintain a magnetic field as is known in the art.

In some examples, the reactive gas species include ammonia. Moreover, the inert gas species can include at least one of nitrogen, helium, argon, neon, krypton and xenon. Providing the process gas can include flowing the process gas into a discharge section of the one or more plasma sources. In some examples, the substrate is biased by 13.56 MHz discharge for processing a 300 mm by 400 mm substrate. Furthermore, the plasma can include radicals and ions of the process gas. In some capacitive discharges, the frequency is between 20 kHz and 150 kHz. In some it is 38 kHz or 40 kHz.

In some examples, forming the plasma includes applying a voltage discharge at a pulse generator to the one or more plasma sources, wherein the applied voltage enables accelerating voltages that split ammonia into hydrogen and nitrogen species. Moreover, forming the plasma can include producing electric currents by electromagnetic induction by time-varying magnetic fields to form inductively coupled plasma. Furthermore, forming the plasma can include passing a time-varying electric current through a coil to create a time-varying magnetic field around the coil, which in turn induces azimuthal electric field in the rarefied gas, wherein the rarefied gas is argon.

In some examples, the first layer includes a metal seed layer or semi-noble metal layer, the treatment of the first layer includes removal of oxides, carbon compounds, or other contaminants from the metal seed layer or semi-noble metal layer. In some examples, the method further includes depositing a second layer over the first layer after exposing the first layer to the plasma.

A plasma apparatus is also provided herein. The apparatus includes a processing chamber, which includes a substrate web such as a web for supporting a substrate as it processed through multiple processing areas of the processing chamber. The apparatus also includes a plasma source remote from the substrate web. The plasma source is configured to generate plasma to produce radicals of a reducing gas species, produce ions and other charged species of the reducing gas species, and produce photons from the reducing gas species.

In some examples, the reducing gas species flows from the remote plasma source towards the substrate on the substrate web. Furthermore, the plasma can include ions from an Ammonia glow discharge.

While multiple examples are disclosed, still other examples of the present disclosure will become apparent to those skilled in the art from the following detailed description, which describes illustrative examples of the disclosure. Accordingly, the detailed description is to be regarded as illustrative in nature and not restrictive.

BRIEF DESCRIPTION OF THE DRAWINGS

The accompanying drawings, which are incorporated in and constitute a part of this specification, exemplify the examples of the present disclosure and, together with the description, serve to explain and illustrate principles of the disclosure. The drawings are intended to illustrate major features of the exemplary examples in a diagrammatic manner. The drawings are not intended to depict every feature of actual example nor relative dimensions of the depicted elements and are not drawn to scale.

Figure 1:
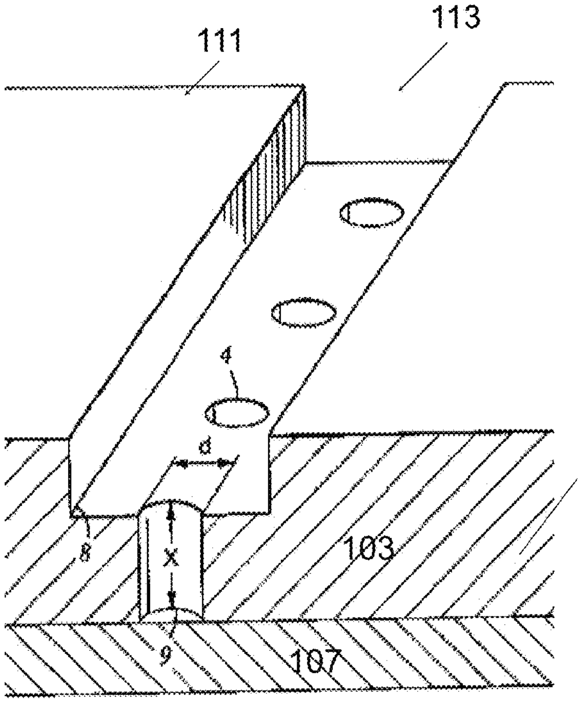
FIG. 1 is an exemplary substrate with an electronic via formed within an electrically insulative or dielectric layer, as known in the current state of the art.

While the disclosure is amenable to various modifications and alternative forms, a specific example has been shown in the drawings and are described in detail below. The intention, however, is not to limit the disclosure to the example described. On the contrary, the disclosure is intended to cover all modifications, equivalents, and alternatives falling within the scope of the disclosure as defined by the appended claims.

DETAILED DESCRIPTION

The present disclosure is directed towards, among other things, improving adhesion of electroplated metal onto polymer surfaces while also decreasing contact resistance of metal surfaces. The present disclosure also provides for treating the substrate to remove the oxide that naturally forms in the process of fabricating a barrier layer on the first layer. In some examples, the barrier layer includes a chrome layer and a copper layer, which acts as the seed layer to electroplate a subsequent set of interconnect wires. The present disclosure also provides a dielectric layer with a strong adhesive bond for the next wiring layer, and a barrier level with an oxygen free, low resistance contact to the base metal layer exposed within the vias of the dielectric layer.

FIG. 1 is an exemplary substrate 100, in accordance with an example of the disclosure. The disclosure relates to treating the substrate 100 to form multi layered interconnects. The substrate 100 may be incorporated in, for example, a wafer, a circuit board, a flexible circuit, or a spring circuit. The substrate 100 may be multilayered and configured to include electrical contacts 9 adjacent to a first series of interconnect wires of a lower metal layer 107.

An electrically insulative layer (i.e., dielectric layer 103) may be added to the lower metal layer 107 with vias 4 within the dielectric layer 103. The vias may expose layer 107 at the bottom of the vias for interposer connections. In some examples, the electrically insulative layer may include a fluorinated polyimide, fluorinated polymers, such as polytetrafluoroethylene (PTFE), polyvinylidene fluoride copolymer (PVDF-CP), a perfluoroalkoxy alkane polymer (PFA), Fluorinated ethylene propylene (FEP), Ethylene tetrafluoroethylene (ETFE), polyvinylidene fluoride (PVF), polymonochlorotrifluoroethylene (PCTFE), fluoroelastomer (FKM), perfluoroelastomer (FFKM), tetrafluoroethylene/propylene (FEPM), fluoropolymer (PFSA), and/or sulfonated tetrafluoroethylene based fluoropolymer-copolymer (e.g., Nafion©). In the event Nafion© is implemented in the exemplary substrate, the substrate is prepared for catalyst sputter in a treatment phase. The electrical via 4 may be formed to predetermined specifications, such as a diameter d, and depth X.

A subsequent metal layer may be formed on the substrate 100, in addition to an underlying metallization layer or a gate electrode layer. A via mask 111 may be formed with openings 113. The openings 113 may be located where the vias 4 will be formed. The subsequent layer may include a second series of interconnect wires. The dielectric layer 103 is interposed between the first and subsequent layers. The vias within the dielectric layer are configured to facilitate an electrical connection between the first series of interconnect wires of the first layer and the second series of interconnect wires of the subsequent layer.

In typical substrate manufacturing, a very complex process of drilling, cleaning, and etching a seed layer is implemented to form the vias 4. The drilling process requires a single drill operating one at a time to form each individual via 4. As a result, forming a substrate with multiple vias is typically time consuming and an inefficient use of resources. In contrast, the present disclosure implements a photo imagable dielectric or a photoresist mask to fabricate the vias. The present disclosure also implements a sputtering process to form a seed layer, and thus a subsequent layer. In this way, the disclosed process is able to form a substrate with an infinite number of vias that do not increase time or drain resources.

An etching process may be implemented to remove portions of the dielectric layer 103 to fabricate the vias therethrough and extending towards the electrical contacts 9 of the lower metal layer 107. The vias 4 in the dielectric layer 103 are positioned over the electrical contacts 9 to allow for electrical continuity between the upper and lower metal layers at the via 4.

Thereafter, a thin layer of relatively conductive barrier layer material 8 may be formed on the exposed surfaces of the substrate 100. For example, the barrier layer material 8 may be formed on the dielectric layer 103 and the length X of the sidewalls of the via 4. The conductive barrier layer material 8 may be made up of chrome, for example. In this way, the conductive barrier layer material 8 forms an electrical connection between an upper metal layer and a lower metal layer. The conductive barrier layer material 8 may be formed by sputtering adhesion/barrier metals and seed metals over the electrically insulative layer 103. In typical manufacturing processes the interfacial conditions are performed at the time of metal sputtering. Moreover, the electroplated layers do not improve the interfacial condition.

Figure 2:
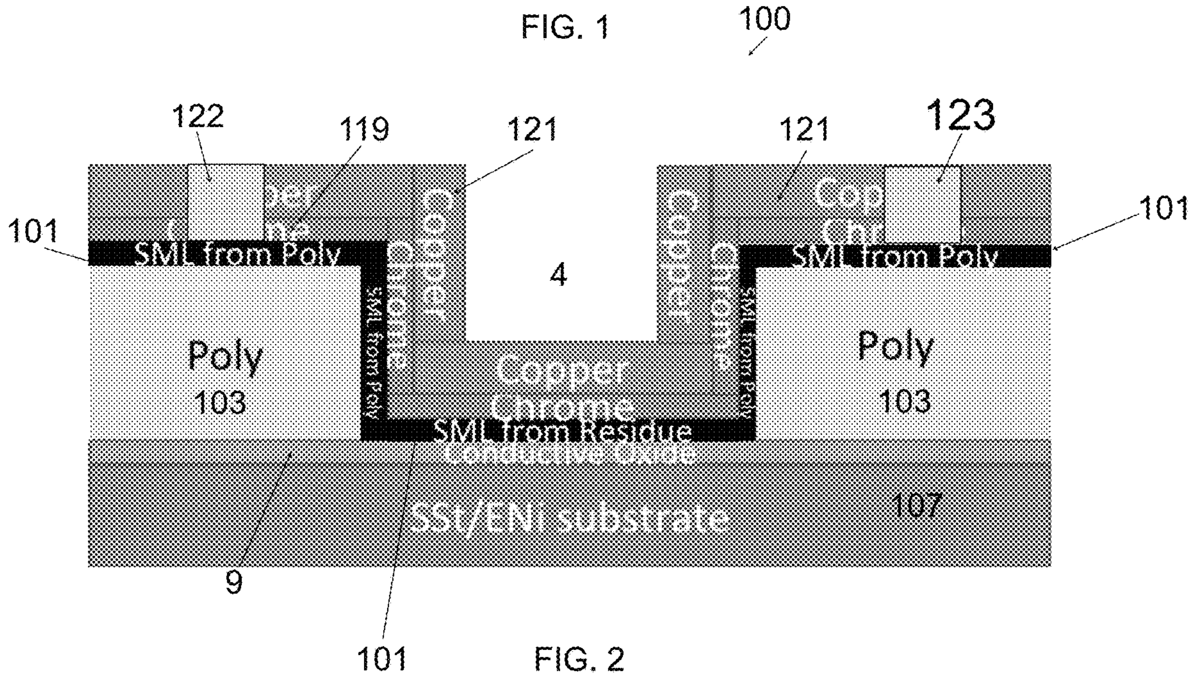
FIG. 2 is a cross-section of an exemplary substrate, in accordance with an example of the disclosure.

FIG. 2 is a cross-section of the exemplary substrate 100, in accordance to an example of the disclosure. More specifically, FIG. 2 illustrates an example of a cross-sectional schematic of the dielectric layer in FIG. 1 after the etched regions have been coated with a conductive barrier layer material 119 and a subsequent metal layer 121. Conductive barrier layer material 119 may be formed, for example, of Chrome (Cr), tantalum nitride (TaN) or titanium nitride (TiN), and in some embodiments pure titanium, NiCr alloys, NiV alloys or other materials known in the art may be used. A chemical vapor deposition (CVD), an atomic layer deposition (ALD), or a physical vapor deposition (PVD) operation may be implemented to deposit the conductive barrier layer material 119.

Prior to coating the etched regions a conductive barrier layer material 119 and a subsequent metal layer 121 the substrate may be transferred to a chamber or apparatus having a vacuum environment. The chamber or apparatus can include a reducing gas species, such as hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$).

During the transfer to the chamber or apparatus, the substrate 100 may be exposed to ambient conditions that can cause the surface of the substrate at the bottom of via, or where no dielectric (103) is present, to oxidize. This may be a barrier layer or another metal like copper, copper alloys, steel, stainless steel, nickel, electroless nickel and the like that makes up the substrate layer. Thus, at least a portion of the metal layer materials may be converted to an oxidized metal. For example, Chrome material deposited on substrates is known to rapidly form Chrome oxide upon exposure to the air. An oxide film can form a layer on top of the exposed Chrome metal (i.e. barrier layer material 119 in this example).

While the substrate is in a vacuum environment, the substrate 100 may be exposed to a plasma formed of a reducing gas species. The plasma may include radicals of the reducing gas species, such as, for example, H*, $NH_2$*, or $N_2H_3$*. The radicals of the reducing gas species react with the metal oxide surface to generate a pure metallic surface. The plasma treatment is configured to produce a reducing environment by taking an oxidized metal ion and adding electrons, to bring it to the metallic state. Thus, the metal is reduced to its ground state or metallic state.

The radicals of the reducing gas species, ions from the reducing gas species, ultraviolet (UV) radiation from the reducing gas species, or the reducing gas species itself reacts with the metal oxide under conditions that convert the metal oxide to metal in the form of a film integrated with the metal seed layer or semi-noble metal layer. Oxygen, or reaction by-products such as water, nitrous oxide ($N_2O$), $CO_2$, NO, $NO_2$, or other volatile oxygen baring species are given off.

Forming gas typically includes argon (Ar) or other noble gases with hydrogen gas added (e.g., 1-12%). The degree of active reducing gas species from hydrogen depends on the relative ability to ionize the gas. For example, Ar and other noble gases of greater molecular weight are ionized at a lower electronvolt (eV). The presence of argon, however, short-circuits the generation of reducing species in the plasma. Furthermore, argon ionizes at a lower eV, leaving ammonia, hydrogen, or other reducing species in the forming gas unreacted and useless. Ammonia is more difficult than hydrogen to ionize.

The Ar is selectively ionized in the presence of $H_2$, so that no active hydrogen species would be formed in the plasma. The Ar plasma relies on a physical removal of material. The physical removal of material causes the surface to become conductive or the surface resistance of the dielectric layer to become a conductor. In other words, the resistance drops to the point that it becomes a conductor, which can be an undesired side effect of using noble gas (e.g., argon, helium, neon, krypton) as the plasma gas material.

In contrast, the present disclosure provides a plasma with a chemical species configured to reduce the metal and cause the oxygen to be removed from the surface, through chemical means rather than through physical means. In other words, the present disclosure provides a plasma that generates chemical reduction, allowing the metal to remain in place. The plasma with chemical species is more efficient than the Ar method of removing material from the surface. The plasma includes nitrogen, nitrogen radicals, hydrogen, and other species.

A layer of copper 121 may be electroplated on the substrate. The substrate with the copper seed layer 121 can be, for example, immersed in an electroplating bath containing positive ions of copper and associated anions in an acid solution. At the plating bath, a bulk layer of copper 121 is electroplated onto the substrate to fill the features, including the vias 4.

The substrate 100 can also include nets 122 and 123, which may be positioned on the dielectric layer, separating sections of the layer of copper 121. As the spaces between the copper 121 wires decrease leading to a higher density of copper wires on the substrate the plasma process to remove the conductive layer becomes more difficult. The disclosed process produces adhesion without converting a polymer surface into a conductive material. Thus, there is no need for additional dry etching of the modified dielectric surface after forming the layer of copper 121.

During the processing of the substrate, the substrate may be exposed to ambient conditions that can cause exposed surfaces of the substrate (which may include copper or alloys thereof, steel, stainless steel, electroless nickel, nickel, etc.) to oxidize. Thus, at least a portion of such metals may be converted to an oxidized metal. With various steps that may expose the exposed surfaces of the substrate to oxidation during processing of the substrate, the present disclosure provides a technique for reducing the negative effects of metal oxides that may form on the exposed surfaces.

Some of the current techniques have many drawbacks. For example, while higher energy ions may be produced in high density plasma (HDP) processing systems and/or sputtering systems, noble gas plasma produces a slow sputter on the oxide present on substrate metal exposed in dielectric vias. Moreover, the substrate may be exposed to a reducing gas species, such as hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$) in the chamber or apparatus. The ion guns implemented in the chamber to utilize a noble gas may be configured to generate plasma which produces a higher energy species of the reducing gases described herein. Specifically, the ion guns may discharge the ions faster than in a glow discharge.

Typically, the use of hydrogen-based plasmas may reduce thick metal oxides, but such techniques add substantial costs and utilize substantially high temperatures (e.g., at least over 200° C., and often to a large percentage of the melting temperature such as over 600° C.). In some instances such processes would destroy polymer based dielectrics and therefore cannot be used. Removal of these metal oxides is generally needed to provide superior conductivity to the substrate material. However, there is a heightened need to remove these metal oxides specifically where the metal seed layers and exposed surfaces include a chrome, titanium, tantalum "tie" layer. In some examples, even a small contamination by oxygen creates a "poisons" effect.

With respect to surface treatment of the electrically insulative layer, in plasma systems, Oxygen and/or Argon are typically used. The use of pure Argon results in physical bombardment where Sp2 hybridization is the final state of surface carbon-carbon bonds. Hydrogen and fluoride atom are "knocked" loose from the surface forcing dangling free carbon electron pairs to combine into SP2 bonds. Carbon monoxide and HF are the typical gases released by this process that are detectable in an RGA. During the oxidization period, a $Sp_2$ hybridized atom dangling from the etch stop layer 9 or the electrically insulative layer 103 may hybridize to form a surface modified layer (SML) 101. In some examples, it may not/may be necessary to remove the SML to further process the substrate. For example, the SML may allow for plating of electroless nickel (Ni), copper (Cu), silver (Ag), gold (Au) or electrolytic Cu, Ni, Au, Ag, Zinc (Zn). However, the SML may break read/write traces (attenuate signal) in flexures or other differential pairs. Moreover, the SML may short circuit different traces together.

Figure 3A:
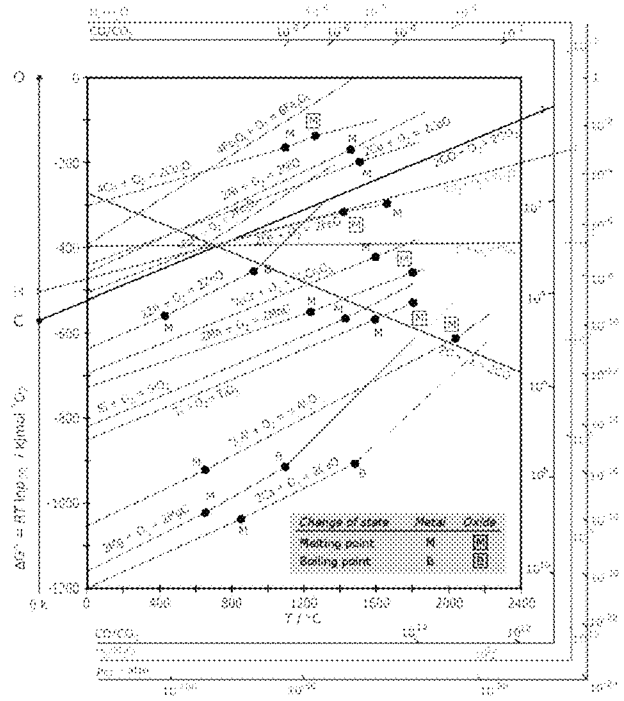
FIGS. 3A-3B are exemplary Ellingham diagrams illustrating the interfacial oxide reduction/removal, in accordance with an example of the disclosure.
Figure 3B:
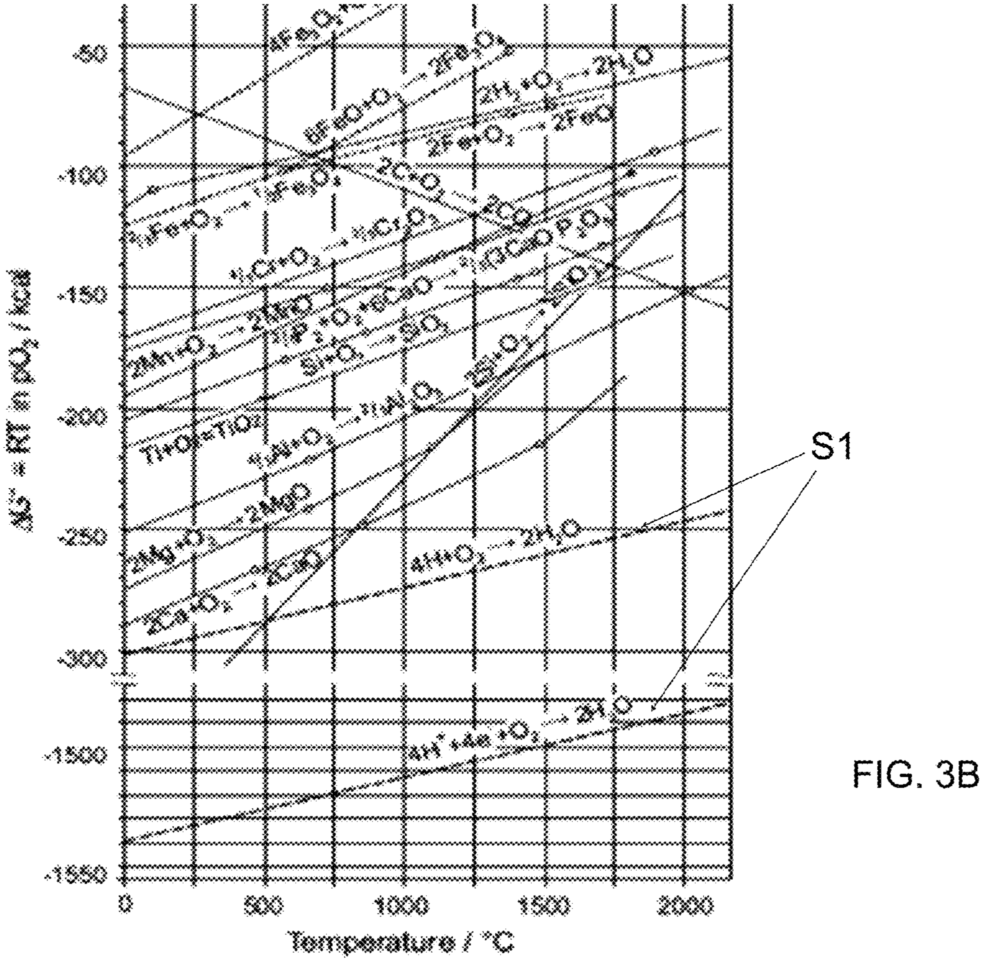

In some examples, the interconnect wires are generally made up of copper, cobalt, or other low resistant metals (and could include tin or nickel). FIGS. 3A-3B are exemplary Ellingham diagrams illustrating the interfacial oxide reduction/removal. The Ellingham diagram illustrates the temperature dependence of the stability for compounds. This analysis is usually used to evaluate the ease of reduction of metal oxides and sulfides. As evidenced by the Ellingham diagrams of FIGS. 3A-3B, copper, cobalt, and similar metals form an oxide on the surface. The disclosure provides an ability to manufacture the substrate such that the metal layer contact resistance to the first layer is low by removing the oxide that naturally forms when fabricating a barrier layer.

Specifically, FIG. 3A is a standard Ellingham diagram that cuts off at usually negative 1200 kilojoules per mole for Gibbs free energy. The lower the position of a metal's line in the Ellingham diagram, the greater is the stability of its oxide. For example, the line for Al (oxidation of aluminum) is found to be below that for Fe (formation of $Fe_2O_3$). As illustrated herein, very high temperatures are needed for hydrogen to refine a metal oxide (i.e., iron or nickel) into the metallic state.

FIG. 3B includes additional values that are not captured on the typical Ellingham diagram. Specifically, reducing plasmas are not typically accounted for on a standard Ellingham diagram. The reducing plasmas include familiar electrochemistry in normal aqueous cleaning systems. Specifically, hydrogen (H) radicals and ions exist in aqueous systems and surfaces immersed in aqueous systems. Therefore, plasma can serve as an electrolyte to support these species. The inclusion of additional data values provides a clear insight to how electrochemical reduction occurs rapidly and at room temperature. Furthermore, based on the additional data points a plasma can be generated that reduces surface oxides in place. For example, species $S_1$ indicate that high voltage plasma needs to be generated, and that the species are common in aqueous atmospheric pressure systems.

FIG. 3B illustrates the underlying electrochemistry processing in aqueous systems. However, these values are not available in vacuum. However, ammonia allows for production of the species $S_1$. The species $S_1$ perform in vacuum as you would expect in atmospheric pressure, aqueous processing. Specifically, the species $S_1$ is configured to remove the oxygen from the metal surface and leave the metal (i.e., reducing). Furthermore, the species $S_1$ is also configured to simply strip the oxidized metal from the surface, leaving only the metallic material.

Argon is easily ionized in traditional plasma, but ammonia is not. The current or power that's used to produce traditional plasma produces simply argon ions and does not produce the species that are beneficial to the process. Thus, the use of a forming gas that has 5% or 10% of a reducing gas proves to be ineffective, because the plasma is not energetic enough, when argon is present, in order to produce the necessary species. As evidenced by the Ellingham diagrams of FIGS. 3A-3B, the necessary species desired require a more negative Gibbs free energy than what hydrogen is able to provide.

Figure 4:
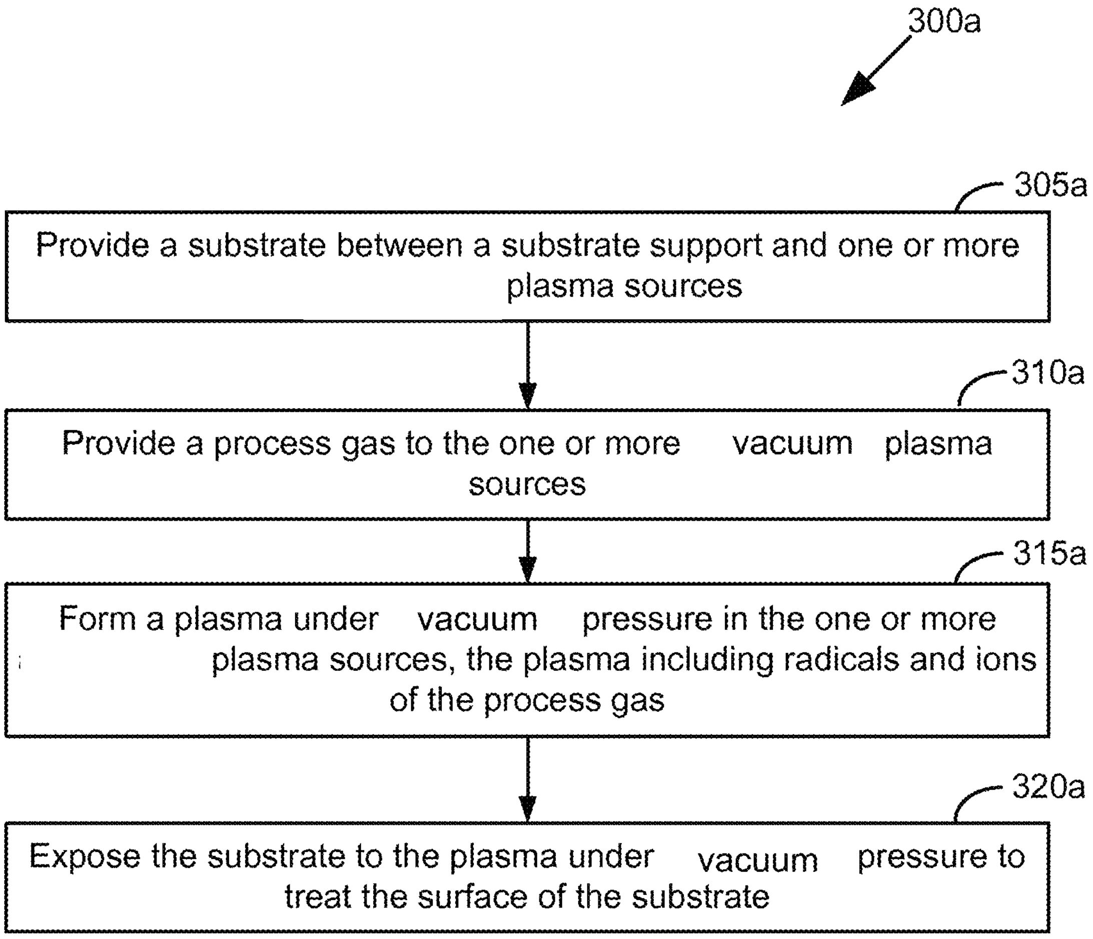
FIG. 4 is an exemplary flow diagram illustrating a method of treating a substrate, according to an example of the disclosure.

FIG. 4 shows an exemplary flow diagram illustrating a process 300*a* of treating a substrate, according to an example of the disclosure. The operations in a process 300*a* may be performed in different orders and/or with different, fewer, or additional operations.

The process 300*a* can begin with step 305*a* where a substrate is provided between a substrate web and one or more plasma sources. A first layer may be formed on the surface of the substrate. The first layer can include, for example, a metal layer such as a PVD-deposited metal seed layer or semi-noble metal layer. The first layer includes the conductive barrier layer material 119, as illustrated in FIG. 2. The first layer can include a polished metal or dielectric layer, such as a post-CMP copper or tungsten layer. The first layer can include a low-k dielectric layer. The first layer may include one or more contaminants. For example, the PVD-deposited metal seed layer or semi-noble metal layer can include metal oxides and/or carbon compounds. The surface of the post-CMP copper or tungsten layer can include any number of surface residues and contaminants. The low-k dielectric material can include silicon, fluorine, hydrogen and/or carbon atoms. In some implementations, the substrate may include features, such as recesses, vias, or trenches, which were described with reference to FIGS. 1 and 2.

The one or more plasma sources can include one or more plasma generators that operate in a vacuum environment. A vacuum environment can include a pressure in a working range of about 0.5 to about 2 milliTorr when using a linear ion source. In some embodiments the pressure is about 1 milliTorr. For an AC glow discharge, a higher pressure in a working range of about 1 to 200 milliTorr is used depending on the power applied. In some embodiments, the pressure is about 10 milliTorr. The one or more plasma sources can generate plasma by implementing an operation of linear ion sources by AC excitation, which can include a corona discharge, a dielectric barrier discharge, and plasma jets. The linear ion sources enables treatment of the substrate on a moving web for improved uniformity. For example, the one or more plasma sources can implement AC or pulsed discharge.

To generate plasma using the one or more plasma sources, a high voltage discharge can be applied. The high voltage discharge enabling accelerating voltages that split ammonia into hydrogen and nitrogen species. The high voltage discharge may be between about 1,500 V and about 5,000 V, or between about 2,500 V and about 3,000 V. Fora 380 mm ion source this is about 400 w and 25 sccm ammonia with pumping speed of vacuum pump adjusting chamber pressure to 1 milliTorr. It will be understood that other ion sources may be implemented, and even preferred for wafers, panels and substrates of varying shapes and sizes.

The high voltage discharge having a frequency between about 20 kHz to 50 kHz and about 100 kHz to 500 kHz. Moreover, the radio frequency discharges at 13.56 MHz, 2.4 GHz, 5 GHz, and others. This application is where a higher pressure is often preferred. Again, having an adjustable pumping speed by means of the normal types of vacuum control equipment (throttle valves and such) is useful to raise the concentration of active species in the plasma by minimizing the flow of raw unreacted gas ($NH_3$, $N_2H_2$, $B_2H_6$, etc.).

The substrate may be provided on a substrate web. In some examples, the web speed past a dual beam ion source is 1 meter/minute to 3 meter/minute, though slower and faster are possible depending on oxide. In some examples, the web speed can range up to 4 meter/minute with a single dual beam linear source for the thinnest oxides. In some examples, multiple sources can be combined to achieve higher web speeds. Thus, the substrate may be provided between the substrate web and the one or more plasma sources so that the substrate may be positioned relatively close to the one or more plasma sources.

The process 300*a* can continue at step 310*a*, where a process gas is provided to the one or more plasma sources. It will be understood that any suitable process gas or combination of gases may be used to form the plasma. The process gas can include a gas mixture of a reactive gas species and an inert (diluting) gas species. Examples of reactive gas species can include but are not limited to hydrogen, ammonia, and hydrazine. For the purposes of this example, the reactive gas species includes ammonia. Examples of inert gas species can include but are not limited to nitrogen, helium, argon, neon, krypton and xenon.

The process gas may be provided by flowing the process gas into a discharge section of the one or more plasma sources. In a plasma jet, the process gas is flowed to a discharge section and excited and converted to plasma. The plasma passes through a jet head to the surface of the substrate to be treated. The substrate may be biased, for example, by 13.56 MHz capacitive discharge for processing a 300 mm by 400 mm substrate, or alternatively round wafers with typical plasma tools utilized for processing round wafers. The plasma power may be 350 watts power tuned to no reflection. It is to be noted that those of ordinary skill in the art will recognize that the exemplary sizes described herein may be adjusted to obtain similar results for different substrate sizes. A high voltage pulse generator can excite the process gas and convert it to plasma using 550V substrate bias.

The flow rate of the reducing gas species can vary depending on the size of the substrate for processing. For example, the flow rate of the reducing gas species (i.e., ammonia) can be between about 25 standard cubic centimeter per minute (sccm) and about 100 sccm for processing. Note that the lower flow rate value can be even lower with appropriate vacuum control structures and equipment. In some examples, the flow rate of the ammonia is 75 sccm. Higher and lower flow rates may be implemented herein. There exists a need to balance the flow rate and the pumping speed to achieve the desired chamber pressure. A high flow rate can dilute active species at given power a single 450 mm substrate. Other wafer sizes can also apply. For example, the flow rate of the reducing gas species can be 75 sccm for processing a single 300 mm by 400 mm substrate. The reducing chamber can be pumped down to a vacuum environment or a reduced pressure of between about 10 milliTorr. In some examples, higher powers can provide more hydrogen upon demand. When reducing metal oxides on the substrate, the uniformity as well as the rate of the reduction on the substrate may be tuned. In some examples, the process may allow for a five second dwell time once the plasma is tuned.

Figure 5A:
FIG. 5A illustrates the results of a residual gas analyzer (RGA), according to an example of the disclosure.

The process gas (i.e., ammonia) flowing from the plasma source can be ignited to form the plasma by applying a high voltage to the plasma source. An easily ignited gas may be used to light the plasma such as Ar, He, and the like. Once the plasma is ignited, the flow of Ar, He, etc. can be turned off thereby maximizing the efficacy of the reducing gas plasma. The plasma may include radicals, ions, and UV radiation from a reducing gas species. FIG. 5A illustrates the results of a residual gas analyzer (RGA), which is mass spectrometer, operative to process control and contamination monitoring in vacuum systems. As shown in FIG. 5A, argon is used to ignite the process gas flowing to form the plasma, at which point the argon gas flow is curtailed resulting in gas flow that only contains ammonia.

Figure 5B:
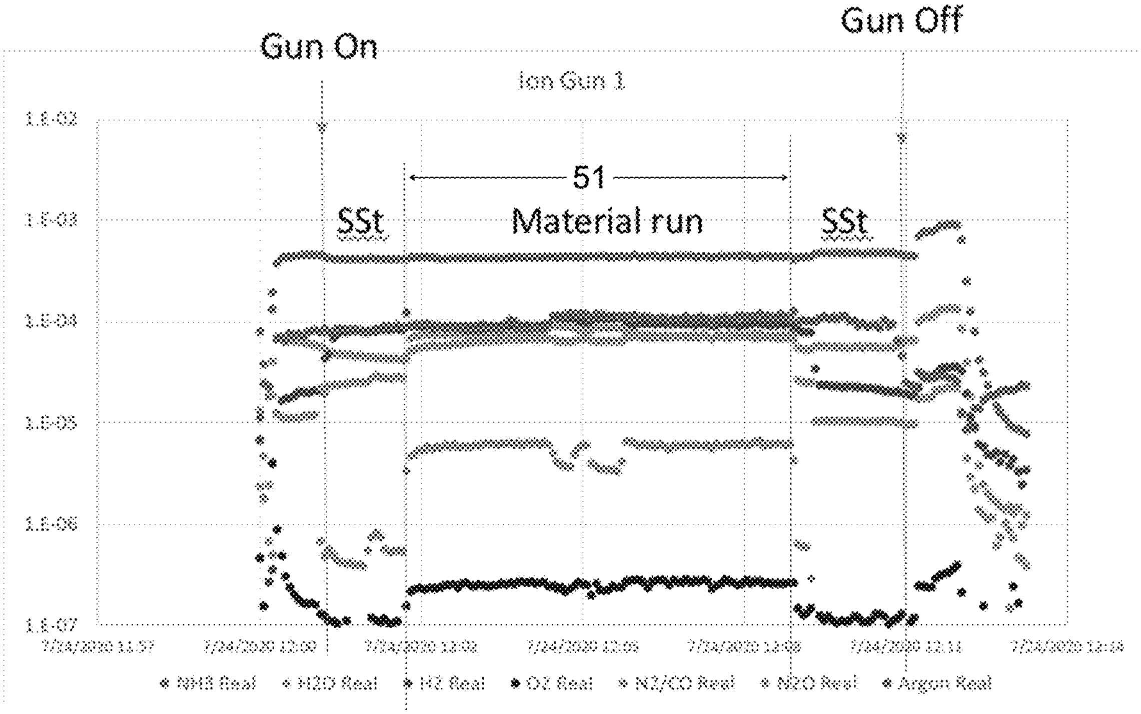
FIG. 5B illustrates the results of a residual gas analyzer (RGA), according to an example of the disclosure.

FIG. 5B illustrates the results of a residual gas analyzer (RGA), according to an example of the disclosure. The RGA monitors the contaminants under a high voltage discharge having a frequency of 38 kHz. Moreover, FIG. 5B illustrates an ion gun zone 51. FIG. 5B also illustrates an increase of water when material enters the ion gun zone 51. There is an expected reduction of surface oxide and water evolution. FIG. 5B also illustrates a significant amount of nitrous oxide $N_2O$ and carbon monoxide CO. This indicates substituting amines on polyimide surface, a permanent change to polymer, and that the coating is non-conductive.

Referring back to FIG. 4, process 300*a* can continue at step 315*a*, where plasma is formed under vacuum in the one or more plasma sources. The plasma can include radicals and ions of the process gas. In some implementations, the plasma includes radicals and ions of the process gas as well as photons (e.g., UV radiation) generated from the process gas. To form the plasma, a pulse generator can apply a high voltage discharge to the one or more plasma sources. The pulse generator can apply a voltage greater than a breakdown voltage of the process gas. In some examples, the applied voltage can be between about 1,500 V and about 5,000 V, or between about 2,500 V and about 3,000 V. The high voltage discharge enabling accelerating voltages that split ammonia into hydrogen and nitrogen species.

In some examples, the plasma may be inductively coupled plasma (ICP). ICP may be formed by producing electric currents by electromagnetic induction, that is, by time-varying magnetic fields. A benefit of ICP discharges is that they are relatively free of contamination because the electrodes are completely outside the reaction chamber. By contrast, in a capacitively coupled plasma (CCP), the electrodes are often placed inside the reactor and are thus exposed to the plasma and subsequent reactive chemical species. When a time-varying electric current is passed through the coil, it creates a time-varying magnetic field around it, which in turn induces azimuthal electric field in the rarefied gas, leading to the formation of the figure-8 electron trajectories providing a plasma generation. In some examples, argon may be used as a rarefied gas. ICP also enables creation of active hydrogen species. Moreover, plasma can be directed and therefore uniformly applied to a substrate.

The plasma may be formed at a low pressure or at vacuum. For a 380 mm ion source this is about 400 w and 25 sccm ammonia with pumping speed of vacuum pump adjusting chamber pressure to 1 milliTorr. It will be understood that other ion sources may be implemented, and even preferred for wafers, panels and substrates of varying shapes and sizes.

The process 300*a* can continue at step 320*a*, where the substrate is exposed to the plasma under vacuum to treat the surface of the substrate. The radicals, ions, and/or photons (e.g., UV radiation) from the process gas may react with the first layer of the substrate. Treatment of the first layer on the substrate may remove contaminants in the first layer prior to deposition of a second layer.

The first layer may be treated by exposure to the plasma under vacuum. For example, the first layer may include a metal seed layer or semi-noble metal layer, where the treatment of the first layer can include removal of oxides, carbon compounds, or other contaminants from the metal seed layer or semi-noble metal layer. The first layer may include a post-CMP copper or tungsten layer, where treatment of the first layer may remove surface residues and other contaminants from the post-CMP copper or tungsten layer. The first layer may include a low-k dielectric material, where treatment of the first layer may remove hydrogen and/or carbon atoms from the low-k dielectric material.

In some implementations, the process 300*a* can further include depositing a second layer over the first layer after exposing the first layer to the plasma. For example, where the first layer includes a metal seed layer or semi-noble metal layer (e.g., chrome), the second layer can include a bulk electroplated metal layer (e.g., copper). Where the first layer includes a post-CMP copper or tungsten layer, the second layer can include a hard mask layer. Where the first layer includes a low-k dielectric, the second layer can include an etch stop layer. In other embodiments, the dielectric is a polymer, in even further embodiments the dielectric is a fluorinated polymer.

Figure 6:
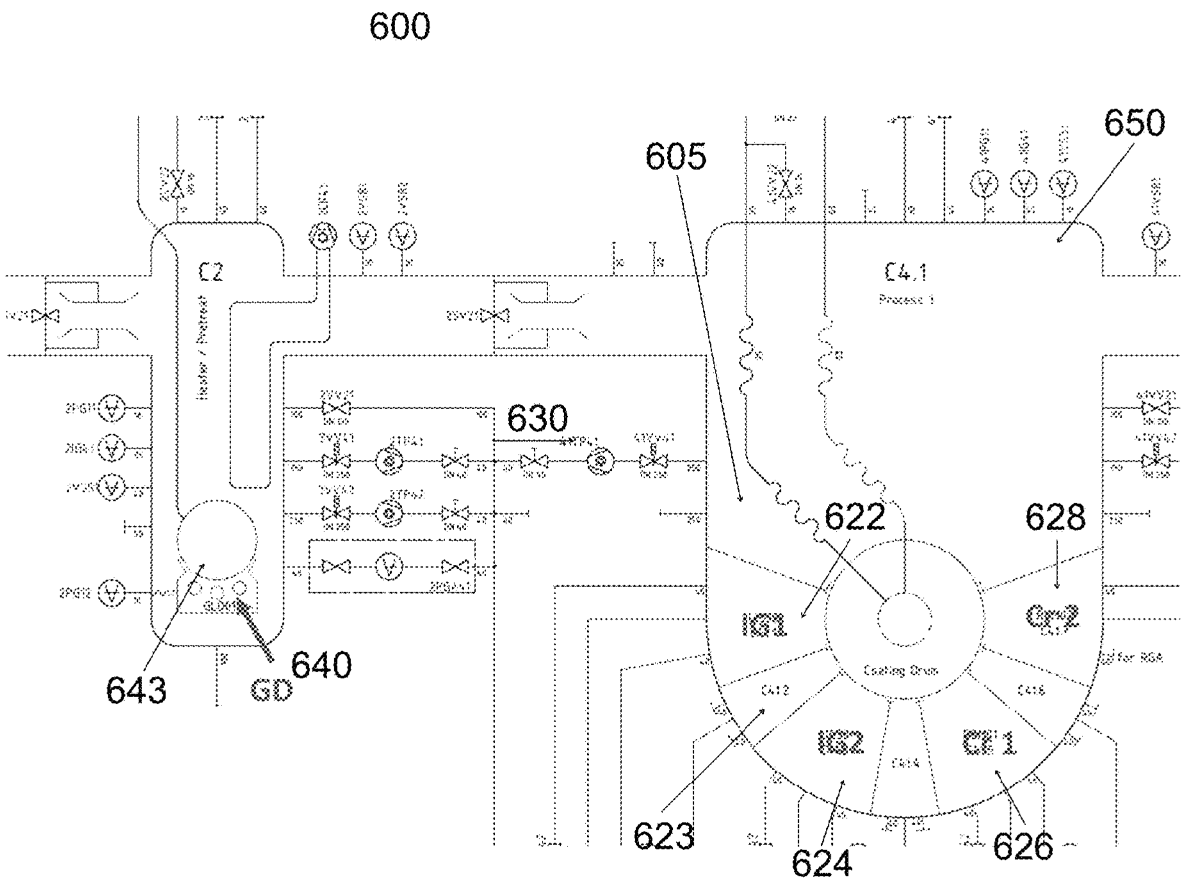
FIG. 6 shows an example of a schematic diagram of a plasma apparatus, according to an example of the disclosure.

FIG. 6 shows an example of a plasma apparatus and a processing chamber, according to an example of the disclosure. The plasma apparatus 600 includes a processing chamber 650, which includes a substrate web 605 such as a web for supporting a substrate as it processed through multiple processing areas of the processing chamber 650. The plasma apparatus 600 also includes a plasma source 640 remote from the substrate web 605. The plasma apparatus also includes a cooling drum 643 that the substrate web 605 passes through to maintain the substrate below a critical temperature. A reducing gas species can flow from the plasma source 640 towards the substrate on the substrate web 605 in direction 630. A plasma may be generated in the plasma source 640 to produce radicals of the reducing gas species. The plasma source 640 may also produce ions and other charged species of the reducing gas species. The plasma may also generate photons, such as UV radiation, from the reducing gas species. For example, coils may surround the walls of the plasma source and generate inductively coupled plasma (ICP) in the plasma source 640.

Reducing gas species are delivered from a gas inlet into an internal volume of the plasma source 640. The power supplied to the coils can generate a plasma with the reducing gas species to form radicals of the reducing gas species. The radicals formed in the plasma source 640 can be carried in the gas phase towards the substrate on the substrate web 605. The radicals of the reducing gas species can reduce metal oxides on the surface of the substrate. In some examples of the disclosure, etch organic gases with oxygen, Nitrogen Trifluoride (NF3), Sulfur Hexafluoride (SF6), CNBr (Cyanogen Bromide) carbon tetrafluoride/tetrafluoromethane (CF4), Argon (Ar), and or combinations thereof may be implemented herein.

In addition to radicals of the reducing gas species, the plasma can also include ions from a glow discharge and other charged species of the reducing gas species. In some examples, the glow discharge is Argon glow discharge in RF plasma at 400 w for 1 minute. Alternatively, the glow discharge is an argon/80% oxygen at 40 kHz glow discharge plasma for 1 minute in a separate machine as a pretreatment. The improved ion gun power and dwell time produces better adhesion strength at the interface. In an alternative embodiment, an atmospheric pressure oxygen capacitive discharge plasma is used. In one example, the atmospheric pressure oxygen capacitive discharge plasma is operated at a variable frequency output from about 10 kHz to 40 kHz, and is particularly suitable for higher volume processing.

Subsequent peel tests on a substrate undergoing the disclosed treatment were tested and exposed to 60 g force/mmm up to as high as 180 g force/mm using 10 um thick copper on a standard coupon during a peel test. In this case, force is equivalent to polymer yield strength. Moreover, the substrate is subjected to a wet clean after the dielectric cure to thin oxides in the vias. For copper substrates, an ideal industry standard composition for a wet clean is Sulfuric Acid.

The plasma may also include neutral molecules of the reducing gas species. Some of the neutral molecules may be recombined molecules of charged species from the reducing gas species. The neutrals or recombined molecules of the reducing gas species can also reduce metal oxides on the surface of the substrate, though they may take longer to react and reduce the metal oxides than the radicals of the reducing gas species.

The ions may be directed towards the surface of the substrate at a plasma distributor at a first ion gun station 622, and a second ion gun station 624 to reduce the metal oxides, or the ions may be accelerated toward the surface of the substrate to reduce the metal oxides if the substrate web 605 has an oppositely charged bias. The first ion gun station 622 and the second ion gun station 624 are separate chambers separated by a differential pumping chamber 623. The differential pumping chamber 623 is configured to remove any gases that escape from either the first ion gun station 622 and the second ion gun station 624. Having species with higher ion energies can allow deeper implantation into the metal seed layer or semi-noble metal layer to create metastable radical species further from the surface of the substrate. The substrate is then positioned towards a first metal sputter station 626 used to sputter and flow the metal in the metal seed layer of the substrate. A second metal sputter station 628 may be provided adjacent to the first metal sputter station 626 to, for example, re-sputter and reflow the metal in the metal seed layer, which can result in a more uniform seed coverage and reduce the aspect ratio for subsequent plating or metal deposition (such as PVD, CVD, ALD). Additionally, the second station 626 can sputter a different metal than the first to create a stack up of layers each with its own thickness and purpose. For example, a barrier layer or an adhesion promotion layer may be first formed, followed by a conductive seed layer useful for subsequent electroplating.

A controller may contain instructions for controlling parameters for the operation of the plasma apparatus. The controller will typically include one or more memory devices and one or more processors. The processor may include a CPU or computer, analog and/or digital input/output connections, stepper motor controller boards, etc.

Figure 7:
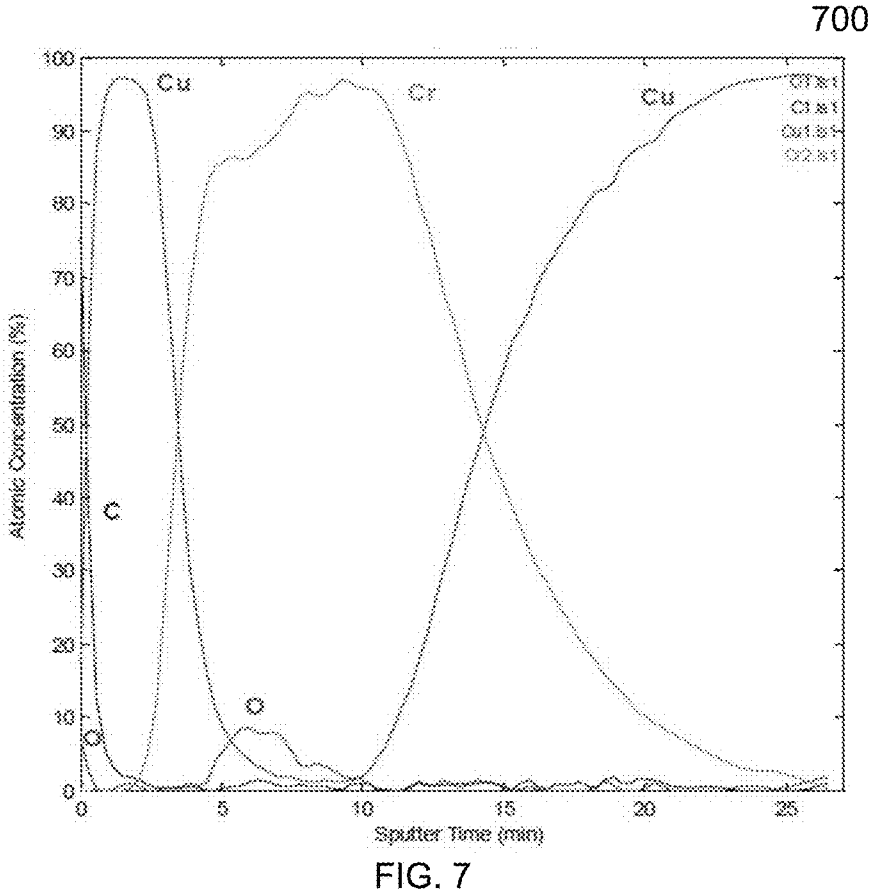
FIG. 7 illustrates the atomic concentration present at the interface of the metal seed layer and the semi-noble metal layer, according to an example of the disclosure.

FIG. 7 is a graphical illustration 700 of the atomic concentration present at the interface of the metal seed layer and the semi-noble metal layer. As illustrated in FIG. 7, at the substrate, copper and chrome interface, oxygen is practically eliminated at the interface of the metal seed layer and the semi-noble metal layer. Carbon atomic concentration is present due to interference of an adjacent dielectric. Titanium (Ti) is present due to substrate material being a common copper alloy (e.g., 3% Ti alloy).

Figure 8:
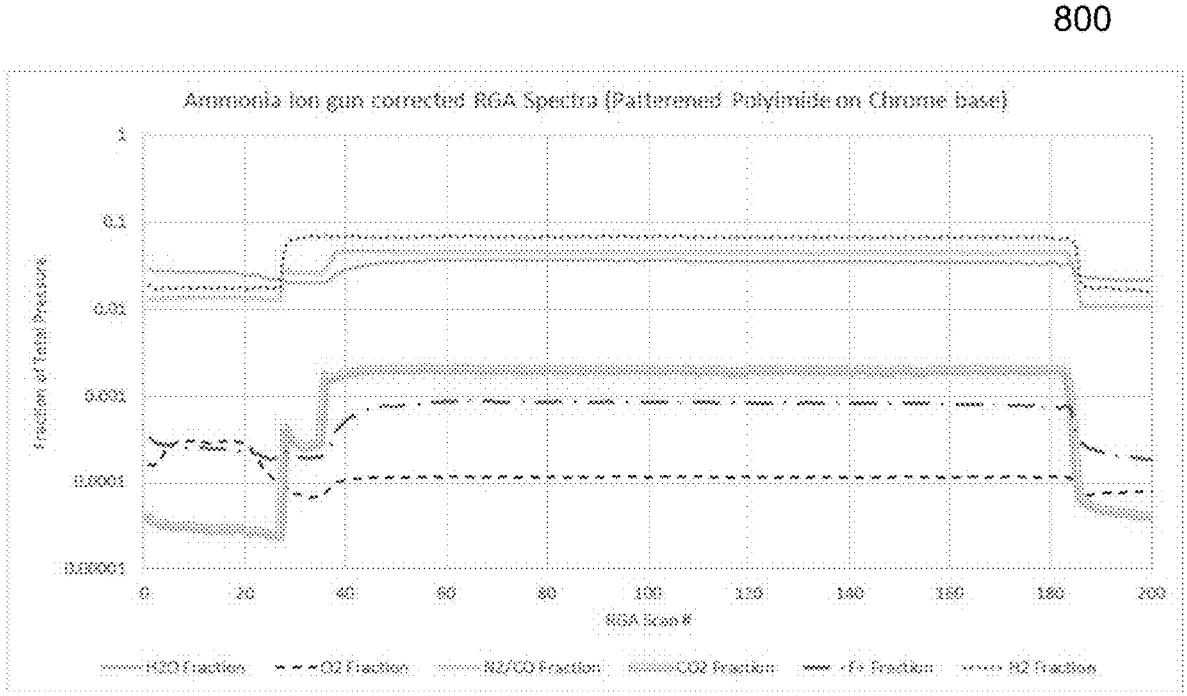
FIG. 8 illustrates the results of a residual gas analyzer (RGA) on the polymer dielectrics, according to an example of the disclosure.

FIG. 8 is a graphical illustration 800 of the results of a residual gas analyzer (RGA) on the polymer dielectrics, according to an example of the disclosure. As illustrated in FIG. 8, the present disclosure raises surface energy and improves water contact angle of the surface of the substrate. The present disclosure also leads to improved adhesion of sputtered metals and adhesives. The water contact angle reduced from 128 degrees (hydrophobic) to 67 degrees (hydrophilic) on fluorinated polymers. The water contact angle reduction does not cause surface conductivity to increase. Moreover, the argon (noble gas) plasma causes the polymer surfaces to become conductive. In some examples, the present disclosure may accomplish a substitution of nitrogen (N), hydrogen (H) or some combination thereof (NHx) into a polymer chain. The substitutions reduce effects of surface fluorides and amine additions increase surface energy. As a result, some fluorides are removed.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

We claim:

1. A method of treating a substrate comprising:

forming a first layer on a surface of the substrate;

providing a process gas to one or more plasma sources, the process gas includes a gas mixture of a reactive gas species and optionally inert gas species and wherein the one or more plasma sources generate plasma by implementing an operation of linear ion sources by AC excitation;

forming a plasma of the reactive species under vacuum in the one or more plasma sources;

moving the substrate by carrying the substrate on a substrate web at a speed between 1 meter/minute to 3 meter/minute, and wherein the substrate is biased by 13.56 MHz capacitive discharge for processing a 300 mm by 400 mm substrate; and exposing the substrate to the plasma of the reactive species under vacuum to chemically remove contaminants from the first layer on the surface of the substrate by chemical reduction while maintaining the first layer intact;

wherein the one or more plasma sources include one or more plasma generators that operate in a vacuum environment at a pressure of about 0.5 to 2 milliTorr.

2. The method of claim 1, applying a voltage discharge that split ammonia into hydrogen and nitrogen species, wherein the voltage discharge is between 1,500 V and about 5,000 V and the voltage discharge has a frequency between about 20 kHz to 50 kHz and about 100 kHz to 500 kHz.

3. The method of claim 2, wherein the voltage discharge is between 2,500 V and 3,000 V.

4. The method of claim 1, wherein the reactive gas species include ammonia.

5. The method of claim 1, wherein the inert gas species includes at least one of nitrogen, helium, argon, neon, krypton and xenon.

6. The method of claim 1, wherein the step of providing the process gas further comprises flowing the process gas into a discharge section of the one or more plasma sources.

7. The method of claim 1, wherein the plasma can include radicals and ions of the process gas.

8. The method of claim 1, wherein the step of forming the plasma further comprises applying a voltage discharge at a pulse generator to the one or more plasma sources, wherein the applied voltage enables accelerating voltages that split ammonia into hydrogen and nitrogen species.

9. The method of claim 1, wherein the step of forming the plasma further comprises producing electric currents by electromagnetic induction by time-varying magnetic fields to form inductively coupled plasma.

10. The method of claim 9, wherein the step of forming the plasma further comprises passing a time-varying electric current through a coil to create a time-varying magnetic field around the coil, which in turn induces azimuthal electric field in a rarefied gas, wherein the rarefied gas is argon.

11. The method of claim 1, wherein the first layer includes any exposed surface of the substrate which may be comprised of copper or alloys thereof, steel, stainless steel, electroless nickel, or nickel, and treatment of the first layer includes removal of oxides, carbon compounds, or other contaminants from the exposed surfaces of the substrate.

12. The method of claim 1, further comprising depositing a second layer over the first layer after exposing the first layer to the plasma.

* * * * *